US012756378B2

(12) United States Patent
Raihn

(10) Patent No.: US 12,756,378 B2

(45) **Date of Patent: *Oct. 6, 2026**

(54) COMPOSITE TRANSVERSELY-EXCITED FILM BULK ACOUSTIC RESONATOR CIRCUITS HAVING A CAPACITOR FOR IMPROVED REJECTION

(71) Applicant: Murata Manufacturing Co., Ltd., Nagaokakyo (JP)

(72) Inventor: Kurt Raihn, Grass Valley, CA (US)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 101 days.

This patent is subject to a terminal disclaimer.

(21) Appl. No.: 18/817,632

(22) Filed: Aug. 28, 2024

(65) Prior Publication Data

US 2024/0429894 A1 Dec. 26, 2024

Related U.S. Application Data

(63) Continuation of application No. 17/702,679, filed on Mar. 23, 2022, now Pat. No. 12,107,568.

(60) Provisional application No. 63/165,370, filed on Mar. 24, 2021.

(51) Int. Cl.

| | |
|---|---|
| ***H03H 9/64*** | (2006.01) |
| ***H03H 9/02*** | (2006.01) |
| ***H03H 9/145*** | (2006.01) |
| ***H03H 9/25*** | (2006.01) |
| ***H03H 9/54*** | (2006.01) |
| ***H03H 9/56*** | (2006.01) |

(52) U.S. Cl.

CPC ...... *H03H 9/6483* (2013.01); *H03H 9/02228* (2013.01); *H03H 9/145* (2013.01); *H03H 9/25* (2013.01); *H03H 9/542* (2013.01); *H03H 9/568* (2013.01)

(58) Field of Classification Search

CPC ........ H03H 9/6483; H03H 9/145; H03H 9/25; H03H 9/174; H03H 9/542; H03H 9/568; H03H 9/02228

See application file for complete search history.

(56) References Cited

U.S. PATENT DOCUMENTS

| | | | |
|---|---|---|---|
| 6,377,140 | B1 | 4/2002 | Ehara et al. |
| 7,576,471 | B1 | 8/2009 | Solal |
| 7,939,989 | B2 | 5/2011 | Solal et al. |
| 7,941,103 | B2 | 5/2011 | Iwamoto et al. |

(Continued)

OTHER PUBLICATIONS

Abbott et al., "Theoretical Investigation into Spurious Modes Content in SAW Devices with a Dielectric Overcoat", Fourth International Symposium on Acoustic Wave Devices for Future Mobile Communication Systems, 2010, 11 pages.

(Continued)

*Primary Examiner* — John W Poos

(74) *Attorney, Agent, or Firm* — ArentFox Schiff LLP

(57) ABSTRACT

A filter circuit has a resonator circuit with a first acoustic resonator and a second acoustic resonator connected in series on a printed circuit board (PCB). The filter circuit also has a composite resonator circuit formed by a capacitor connected in parallel with the second acoustic resonator on the PCB. The capacitor is configured to improve a steepness of an upper bandpass edge of the filter circuit.

20 Claims, 12 Drawing Sheets

(56) References Cited

U.S. PATENT DOCUMENTS

| | | | |
|---|---|---|---|
| 8,294,331 | B2 | 10/2012 | Abbott et al. |
| 8,736,399 | B2 | 5/2014 | Solski et al. |
| 9,065,424 | B2 | 6/2015 | Nakanishi et al. |
| 9,673,779 | B2 | 6/2017 | Ruile et al. |
| 9,712,139 | B2 | 7/2017 | Taniguchi et al. |
| 9,748,924 | B2 | 8/2017 | Komatsu et al. |
| 9,755,614 | B2 | 9/2017 | Kadota |
| 9,837,984 | B2 | 12/2017 | Khlat et al. |
| 9,929,769 | B1 | 3/2018 | Guyette et al. |
| 10,044,399 | B1 | 8/2018 | Guyette et al. |
| 10,284,176 | B1 | 5/2019 | Solal |
| 10,305,447 | B2 | 5/2019 | Raihn et al. |
| 10,491,192 | B1 * | 11/2019 | Plesski ............... H03H 9/02228 |
| 2001/0028286 | A1 | 10/2001 | Takamine |
| 2005/0212612 | A1 | 9/2005 | Kawakubo et al. |
| 2008/0169882 | A1 | 7/2008 | Ono et al. |
| 2008/0180143 | A1 | 7/2008 | Shigemori et al. |
| 2009/0322444 | A1 * | 12/2009 | Tanaka ................... H03H 9/725 333/132 |
| 2011/0018654 | A1 | 1/2011 | Bradley et al. |
| 2012/0249263 | A1 | 10/2012 | Zhang |
| 2012/0306595 | A1 | 12/2012 | Omote et al. |
| 2013/0090080 | A1 | 4/2013 | Schmidt |
| 2013/0335163 | A1 | 12/2013 | Aggarwal et al. |
| 2014/0266510 | A1 | 9/2014 | Silver et al. |
| 2014/0266511 | A1 | 9/2014 | Turner et al. |
| 2015/0042417 | A1 | 2/2015 | Onodera et al. |
| 2015/0341076 | A1 | 11/2015 | Uejima |
| 2016/0094199 | A1 * | 3/2016 | David .................. H03H 3/0073 333/32 |
| 2016/0126929 | A1 | 5/2016 | Leipold et al. |
| 2016/0294031 | A1 | 10/2016 | Cheng et al. |
| 2017/0179928 | A1 | 6/2017 | Raihn et al. |
| 2017/0222617 | A1 | 8/2017 | Mizoguchi |
| 2017/0302252 | A1 | 10/2017 | Hey-Shipton |
| 2018/0062615 | A1 | 3/2018 | Kato et al. |
| 2021/0013860 | A1 * | 1/2021 | Dyer ...................... H03H 9/132 |

OTHER PUBLICATIONS

K. Yamanouchi and S. Hayama, "SAW Properties of SIO2/128° Y-X LiNb03Structure Fabricated by Magnetron Sputtering Technique", IEEE Transactions on Sonics and Ultrasonics, Jan. 1984, vol. 31, No. 1, pp. 51-57.

Kadota, M . . . "6E-5 High Performance and Miniature Surface Acoustic Wave Devices with Excellent Temperature Stability Using High Density Metal Electrodes", IEEE Ultrasonics Symposium Proceedings, 2007, pp. 496-506.

Solal et al., "Transverse modes suppression and loss reduction for buried electrodes SAW devices", IEEE International Ultrasonics Symposium, San Diego, CA, 2010, pp. 624-628.

Solal et al., "A method to reduce losses in buried electrodes RF SAW resonators", 2011 IEEE International Ultrasonics Symposium, 2011, pp. 324-332.

Wang et al., "A zero TCF band 13 SAW duplexer", 2015 IEEE International Ultrasonics Symposium (IUS), 2015, pp. 1-4.

* cited by examiner

COMPOSITE TRANSVERSELY-EXCITED FILM BULK ACOUSTIC RESONATOR CIRCUITS HAVING A CAPACITOR FOR IMPROVED REJECTION

CROSS REFERENCE TO RELATED APPLICATIONS

This application is a continuation of U.S. patent application Ser. No. 17/702,679, filed Mar. 23, 2022, which claims priority from U.S. Provisional Patent Application No. 63/165,370, filed Mar. 24, 2021, entitled COMPOSITE RESONATORS FOR IMPROVED REJECTION, the entire contents of each of which are hereby incorporated by reference.

TECHNICAL FIELD

This disclosure relates to radio frequency filters using acoustic wave resonators, and specifically to filters for use in communications equipment.

BACKGROUND

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a passband or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are n77, which uses the frequency range from 3300 MHz to 4200 MHZ, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz.

Figure 1:
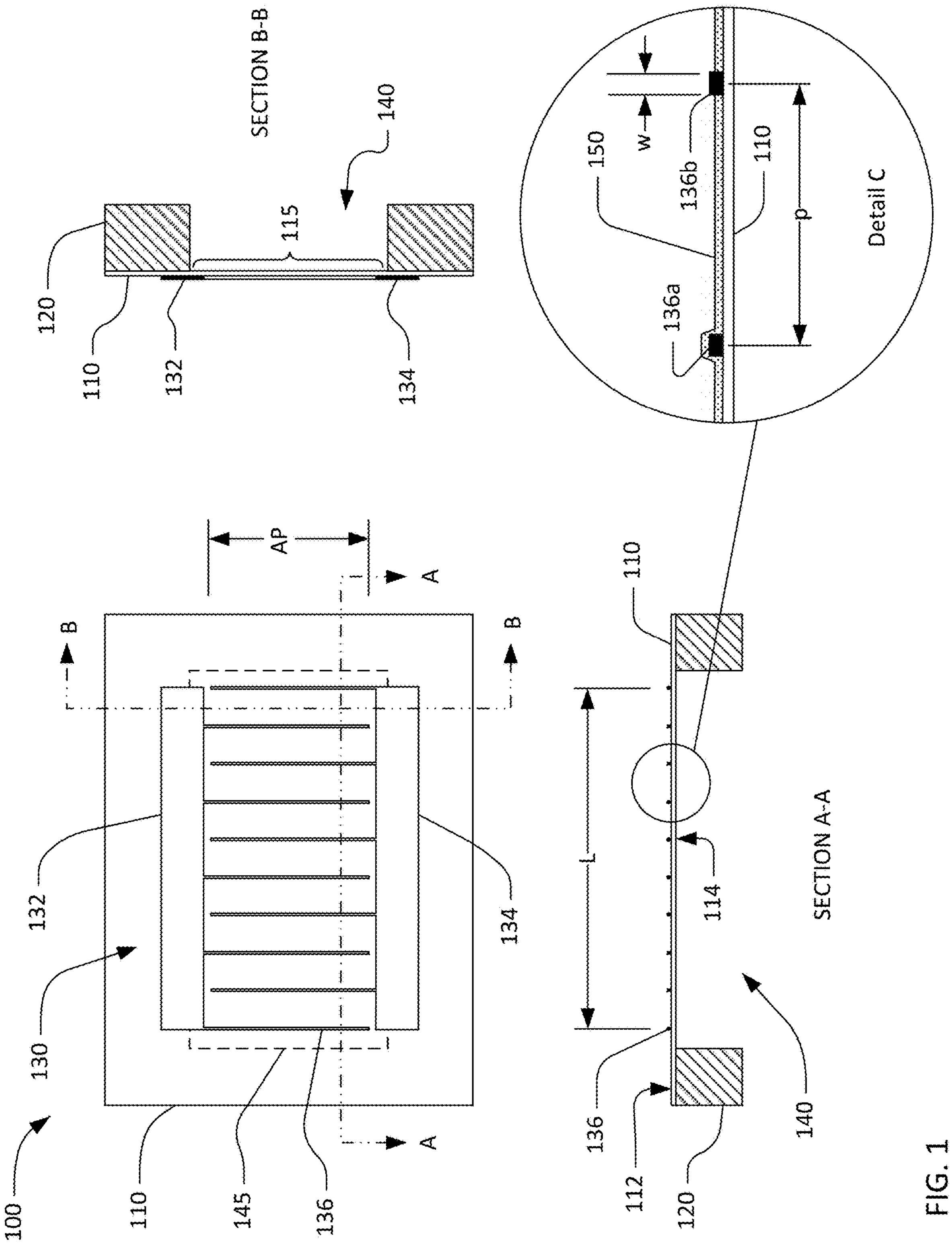
FIG. 1 includes a schematic plan view, two schematic cross-sectional views, and a detailed cross-sectional view of a transversely-excited film bulk acoustic resonator (XBAR).

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Most electrical filters used in the processing of electrical signals are designed to pass desired signal frequencies while simultaneously blocking or attenuating undesirable electrical signal frequencies. For example, it may be desirable to pass passband signal frequencies while simultaneously blocking or attenuating undesirable electrical signal frequencies past the lower and upper passband edges of the passband.

If the desired electrical signal frequency is very close in frequency to an undesired signal frequency, then the electrical filter should transition rapidly from passing the desired signal frequency to rejecting or blocking the undesired signal frequency. This transition creates a steep slope on the edge of the filter between the desired and undesired signal frequencies. A steep slope on the edge of the filter can be a steep slope at or during the transition from the desired to the undesired signals.

For radio frequency (RF) filters, this steep slope can be created by using a composite XBAR circuit having a capacitor for improved rejection. For example, a filter circuit has a cascaded resonator circuit with a first acoustic resonator and a second acoustic resonator connected in series on a printed circuit board (PCB). The admittance as a function of frequency of the second acoustic resonator is substantially identical to the admittance as a function of frequency of the first acoustic resonator. The first and second acoustic resonators may be surface acoustic wave (SAW) resonators or transversely-excited film bulk acoustic resonators (XBARs). A filter circuit also has a composite resonator circuit formed by a capacitor connected in parallel with the second acoustic resonator on the PCB. The capacitor improves a steepness of an upper bandpass edge of the filter circuit. The filter circuit may have a number of series and shunt resonators in a ladder configuration. The cascaded resonator circuit and the composite resonator circuit may be one of the series resonators.

This circuit technique presented enables a sharp transition or a steeping of the slope on the edge of the filter. Other approaches to steepen the filter skirt can result in shortcomings of a degraded level of rejection over the undesired frequency range that limits the filters' ability to reject undesirable electrical signals. A degradation in filter passband response or amplitude over the passband can also occur when implementing other design approaches thus degrading the electrical filters' ability to pass the desired signals.

Description of Apparatus

FIG. 1 shows a simplified schematic top view, orthogonal cross-sectional views, and a detailed cross-sectional view of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz. The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. The piezoelectric plate may be Z-cut (which is to say the Z axis is normal to the front and back surfaces 112, 114), rotated Z-cut, or rotated YX cut. XBARs may be fabricated on piezoelectric plates with other crystallographic orientations.

The back surface 114 of the piezoelectric plate 110 is attached to a surface of the substrate 120 except for a portion of the piezoelectric plate 110 that forms a diaphragm 115 spanning a cavity 140 formed in the substrate. The portion of the piezoelectric plate that spans the cavity is referred to herein as the "diaphragm" 115 due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item". In other configurations, the diaphragm 115 may be contiguous with the piezoelectric plate around at least 50% of the perimeter 145 of the cavity 140.

The substrate 120 provides mechanical support to the piezoelectric plate 110. The substrate 120 may be, for example, silicon, sapphire, quartz, or some other material or combination of materials. The back surface 114 of the piezoelectric plate 110 may be bonded to the substrate 120 using a wafer bonding process. Alternatively, the piezoelectric plate 110 may be grown on the substrate 120 or attached to the substrate in some other manner. The piezoelectric plate 110 may be attached directly to the substrate or may be attached to the substrate 120 via one or more intermediate material layers (not shown in FIG. 1).

"Cavity" has its conventional meaning of "an empty space within a solid body." The cavity 140 may be a hole completely through the substrate 120 (as shown in Section A-A and Section B-B) or a recess in the substrate 120 under the diaphragm 115. The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The term "busbar" is conventionally used to denote a conductor that provides power to or interconnects other elements. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. The primary acoustic mode of an XBAR is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the fingers of the IDT 130 are disposed on the diaphragm 115 of the piezoelectric plate which spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may have more or fewer than four sides, which may be straight or curved.

The detailed cross-section view (Detail C) shows two IDT fingers 136*a*, 136*b* on the surface of the piezoelectric plate 110. The dimension p is the "pitch" of the IDT and the dimension w is the width or "mark" of the IDT fingers. A dielectric layer 150 may be formed between (see IDT finger 136*b*) and optionally over (see IDT finger 136*a*) the IDT fingers. The dielectric layer 150 may be a non-piezoelectric dielectric material, such as silicon dioxide or silicon nitride. The dielectric layer 150 may be formed of multiple layers of two or more materials. The IDT fingers 136*a* and 136*b* may be aluminum, copper, beryllium, gold, tungsten, molybdenum, alloys and combinations thereof, or some other conductive material. Thin (relative to the total thickness of the conductors) layers of other metals, such as chromium or titanium, may be formed under and/or over and/or as layers within the fingers to improve adhesion between the fingers and the piezoelectric plate 110 and/or to passivate or encapsulate the fingers and/or to improve power handling. The busbars of the IDT 130 may be made of the same or different materials as the fingers.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds of parallel fingers in the IDT 110. Similarly, the thickness of the fingers in the cross-sectional views is greatly exaggerated.

Figure 2B:
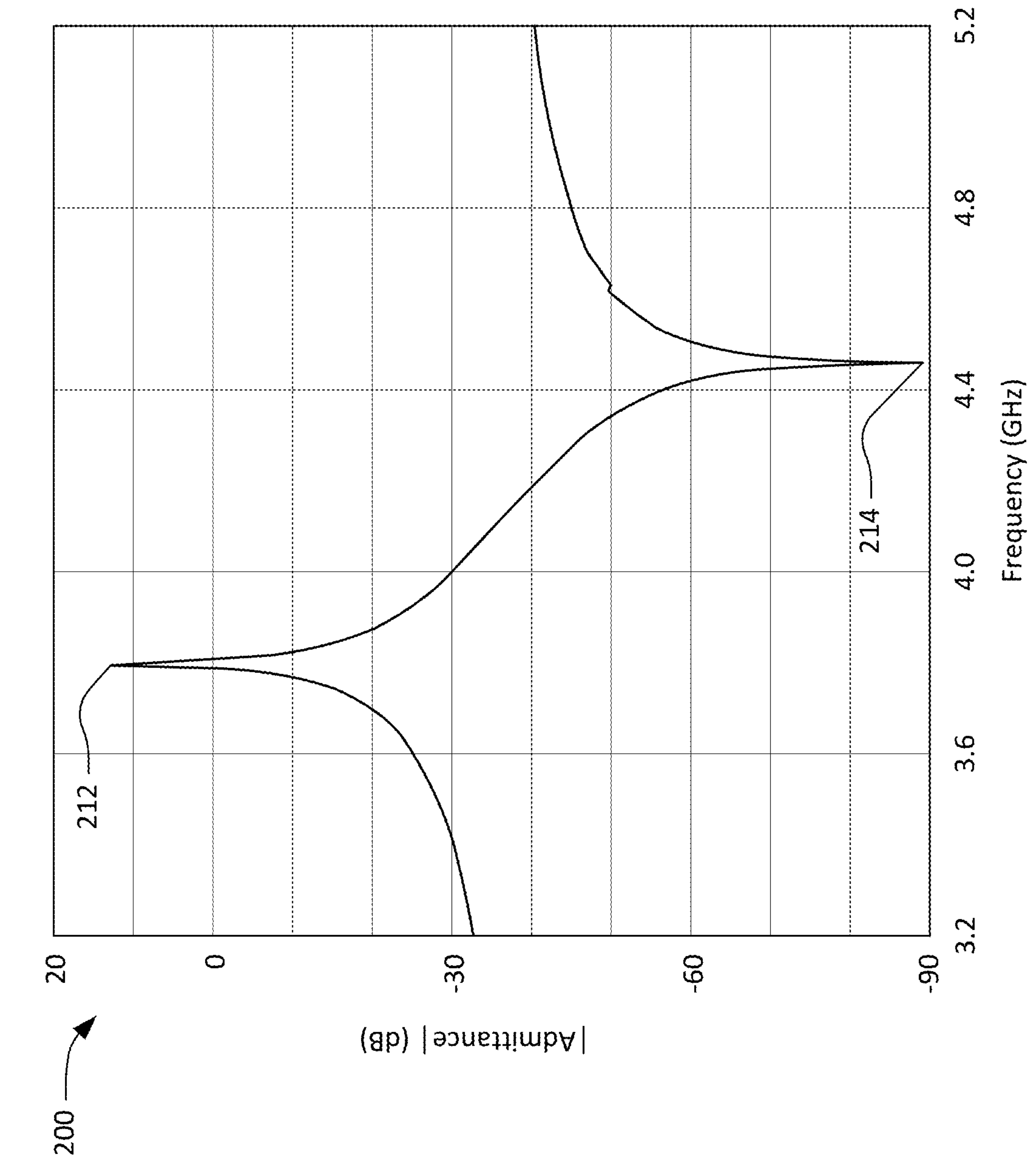
FIG. 2B is a graph of the admittance of an ideal acoustic resonator.
Figure 2A:
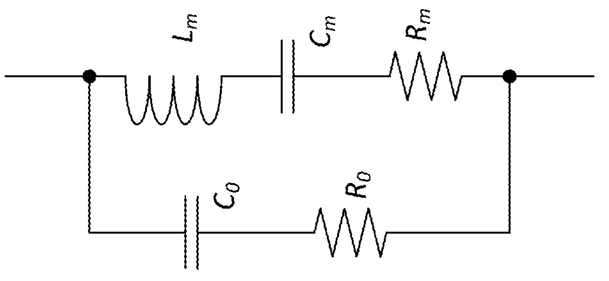
FIG. 2A is an equivalent circuit model of an acoustic resonator.

The basic behavior of acoustic resonators, including XBARs, is commonly described using the Butterworth Van Dyke (BVD) circuit model as shown in FIG. 2A. The BVD circuit model consists of a motional arm and a static arm. The motional arm includes a motional inductance $L_m$, a motional capacitance $C_m$, and a resistance $R_m$. The static arm includes a static capacitance $C_0$ and a resistance $R_0$. While the BVD model does not fully describe the behavior of an acoustic resonator, it does a good job of modeling the two primary resonances that are used to design band-pass filters, duplexers, and multiplexers (multiplexers are filters with more than 2 input or output ports with multiple passbands).

The first primary resonance of the BVD model is the motional resonance caused by the series combination of the motional inductance $L_m$ and the motional capacitance $C_m$. The second primary resonance of the BVD model is the anti-resonance caused by the combination of the motional inductance $L_m$, the motional capacitance $C_m$, and the static capacitance $C_0$. In a lossless resonator ($R_m=R_0=0$), the frequency $F_r$ of the motional resonance (e.g., the "resonance frequency") is given by $$F_r = \frac{1}{2\pi\sqrt{L_m C_m}} \tag{1}$$

The frequency $F_a$ of the anti-resonance (e.g., the "anti-resonance frequency") is given by $$F_a = F_r\sqrt{1+\frac{1}{\gamma}} \tag{2}$$

where $\gamma=C_0/C_m$ is dependent on the resonator structure and the type and the orientation of the crystalline axes of the piezoelectric material.

FIG. 2B is a graph 200 of the magnitude of admittance of a theoretical lossless acoustic resonator. The data in FIG. 2B and subsequent figures was derived by simulation using a finite element method. The acoustic resonator has a resonance 212 at a resonance frequency where the admittance of the resonator approaches infinity. The resonance is due to the series combination of the motional inductance $L_m$ and the motional capacitance $C_m$ in the BVD model of FIG. 2A. The acoustic resonator also exhibits an anti-resonance 214 where the admittance of the resonator approaches zero. The anti-resonance is caused by the combination of the motional inductance $L_m$, the motional capacitance $C_m$, and the static capacitance $C_0$. In a lossless resonator ($R_m=R_0=0$), the frequency $F_r$ of the resonance is given by $$F_r = \frac{1}{2\pi\sqrt{L_m C_m}} \tag{1}$$

The frequency $F_a$ of the anti-resonance is given by $$F_a = F_r\sqrt{1+\frac{1}{\gamma}} \tag{2}$$

In over-simplified terms, the lossless acoustic resonator can be considered a short circuit at the resonance frequency 212 and an open circuit at the anti-resonance frequency 214. The resonance and anti-resonance frequencies in FIG. 2B are representative, and an acoustic resonator may be designed for other frequencies.

Figure 2C:
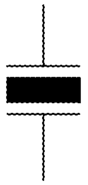
FIG. 2C is a circuit symbol for an acoustic resonator.

FIG. 2C shows the circuit symbol for an acoustic resonator such as an XBAR. This symbol will be used to designate each acoustic resonator in schematic diagrams of filters in subsequent figures.

Figure 2E:
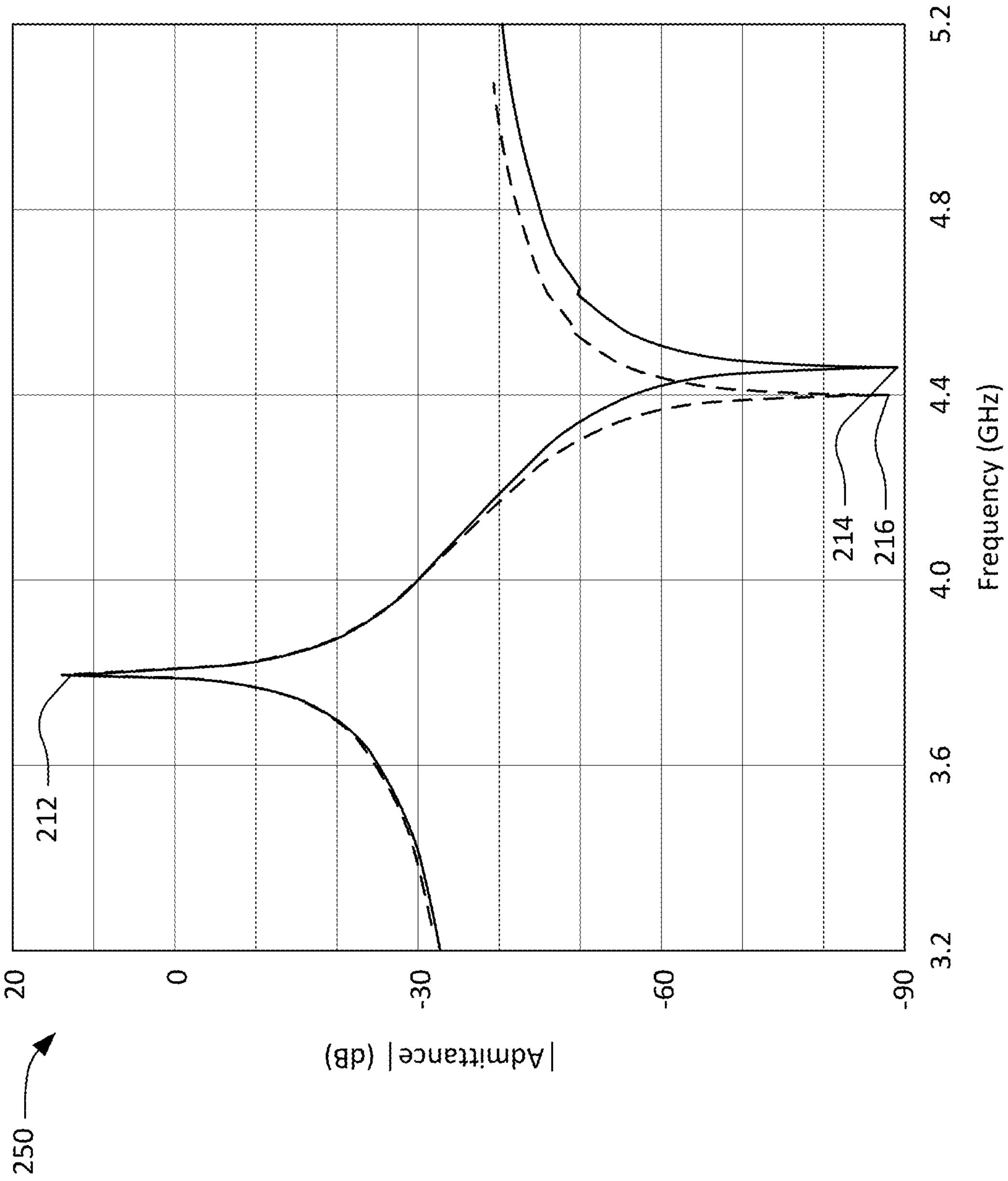
FIG. 2E is a graph of the admittance of an ideal acoustic resonator and of an ideal acoustic resonator with a capacitor connected in parallel.
Figure 2D:
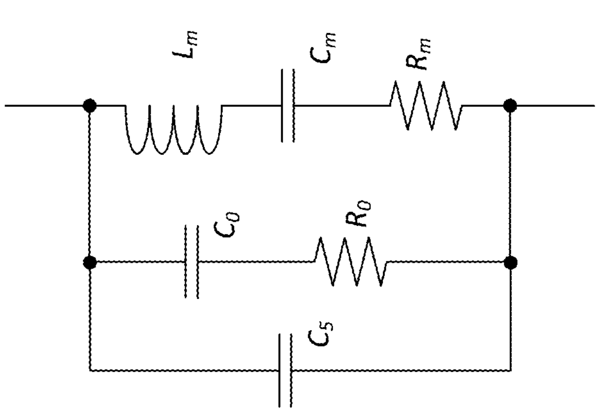
FIG. 2D is an equivalent circuit model of an acoustic resonator with a capacitor connected in parallel.

FIG. 2D is an equivalent circuit model of an acoustic resonator with a capacitor C5 connected in parallel with the resonator. FIG. 2D includes the equivalent circuit model FIG. 2A with capacitor C5 in parallel with the series combination of the motional arm which includes inductance $L_m$, capacitance $C_m$, and resistance $R_m$; and in parallel with the series combination of the static arm which includes capacitance $C_0$ and a resistance $R_0$.

FIG. 2E is a graph 250 of the magnitude of admittance of a theoretical lossless acoustic resonator as shown by the solid line; and of a theoretical lossless resonator with a capacitor C5 connected in parallel as shown by the dashed line. The solid line is the graph 200.

By adding a capacitor C5 in parallel to the BVD model of FIG. 2A the frequency response of the BVD changes from that of the solid line to that of the dashed line. In the frequency response change, location 212 does not change, however, location 214 is shifted lower in frequency by approximately 0.1 GHz. This makes the resonator with a capacitor C5 connected in parallel more desirable when a shorter frequency difference and or steeper slope is desired between the resonance frequency and the anti-resonance frequency.

Figure 2F:
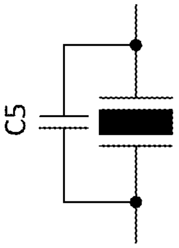
FIG. 2F is a circuit symbol for an acoustic resonator with a capacitor connected in parallel.

FIG. 2F is a circuit symbol for an acoustic resonator with a capacitor C5 connected in parallel.

Figure 3A:
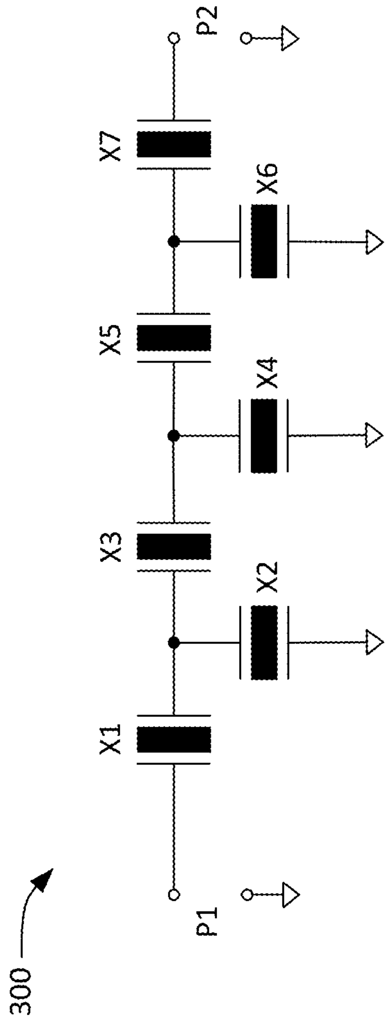
FIG. 3A is a schematic diagram of a bandpass filter using acoustic resonators.

FIG. 3A is a simplified schematic circuit diagram of an exemplary RF filter circuit 300 incorporating seven acoustic wave resonators, labeled X1 through X7, arranged in what is commonly called a "ladder" circuit configuration, or a "half ladder" circuit configuration. A filter of this configuration is commonly used for band-pass filters in communications devices. The filter circuit 300 may be, for example, a transmit filter or a receive filter for incorporation into a communications device. The filter circuit 300 is a two-port network where one terminal of each port is typically connected to a signal ground. The filter circuit 300 includes four series resonators (X1, X3, X5, and X7) connected in series between a first port (P1) and second port (P2). In this patent, the term "series" used as an adjective (e.g. series resonator, series inductor, series capacitor, series resonant circuit) means a component connected in series with other component along signal path extending from the input to the output of a network. Either port may be the input to the filter, with the other port being the output. The filter circuit 300 includes three shunt resonators (X2, X4, and X6). Each shunt resonator is connected between ground and a junction of adjacent series resonators. Other filters may include shunt resonators connected from the input and/or output port and ground. In this patent, the term "shunt" used as an adjective (e.g. shunt resonator, shunt inductor, shunt resonant circuit) means a component connected from a node along the series signal path to ground. The schematic diagram of FIG. 3A is simplified in that passive components, such as the inductances inherent in the conductors interconnecting the resonators, are not shown. The use of seven acoustic wave resonators, four series resonators, and three shunt resonators is exemplary. A band-pass filter circuit may include more than, or fewer than, seven resonators and more than, or fewer than, four series resonators and three shunt resonators. For example, there may be three series resonators and two shunt resonators. In some cases, filter 300 has resonator X3 or X5 replaced by circuit 400, 410 or 420.

Each acoustic wave resonator X1 to X7 may be a SAW. Each acoustic wave resonator X1 to X7 may be a XBAR as shown in FIG. 1 and/or as described in patent application Ser. No. 16/230,443. They could also be a bulk acoustic wave (BAW) resonator, a film bulk acoustic wave (FBAW) resonator, a temperature compensated surface acoustic wave resonator (TC-SAW), a solidly-mounted transversely-excited film bulk acoustic resonator (SM-XBAR) as described in application Ser. No. 16/438,141, or some other type of mechanical or acoustic wave resonator. They could also be any of a number of other types of resonators. All of the acoustic wave resonators are typically, but not necessarily, the same type of resonator.

Figure 3B:
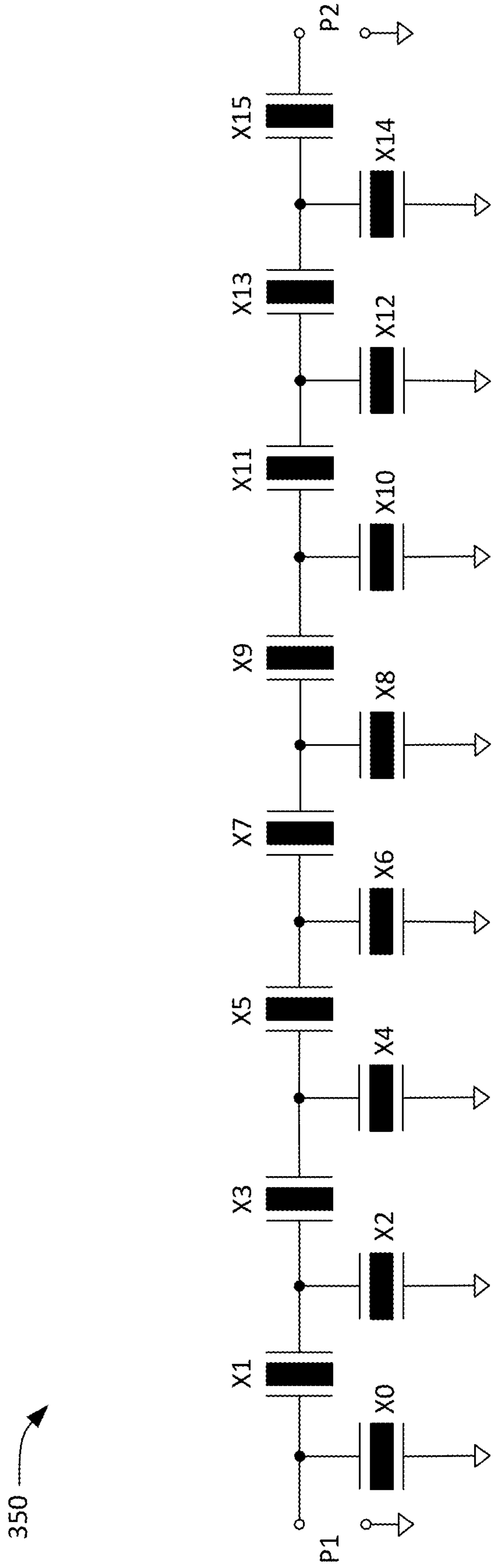
FIG. 3B is a schematic diagram of a bandpass filter using acoustic resonators.

FIG. 3B is a simplified schematic circuit diagram of an exemplary RF filter circuit 350 incorporating fifteen acoustic wave resonators, labeled X0 through X15, arranged in what is commonly called a "ladder" circuit configuration, or a "half ladder" circuit configuration. Filter 350 is similar to filter 300 except that it has more series and shunt resonators and thus a different transfer function. In some cases, filter 350 has resonator X9 or X11 replaced by circuit 400, 410 or 420. The three 8 series and 8 shunt filters may each be filter 350 with X1, X3, X5, X7, X9, X11, X13 and X15 series resonators and X0, X2, X4, X6, X8, X10, X12 and X14 shunt resonators. The first has sixth series resonator X11 split in halves XA and XB; such as by having resonator X11 replaced by filter circuit 400. The second has sixth series resonator X11 split in halves XA and XB with a capacitor C5 in parallel with both halves; such as by having resonator X11 replaced by filter circuit 410. The third has sixth series resonator X11 split in halves XA and XB with a capacitor C5 in parallel with the second half; such as by having resonator X11 replaced by filter circuit 420.

Each acoustic wave resonator in the three filters may be an XBAR. The resonators in these 3 filters may be SAW. They could also be any of a number of other types of resonators (BAW, FBAR, TC-SAW, MEMs, etc.). All of the acoustic wave resonators are typically, but not necessarily, the same type of resonator.

As shown in FIG. 2B, each acoustic resonator exhibits very high admittance at a resonance frequency 212 and very low admittance at an anti-resonance frequency 214 higher in frequency than the resonance frequency. In simplified terms, each resonator is approximately a short circuit at its resonance frequency and an open circuit at its anti-resonance frequency. Thus, the transmission between Port 1 and Port 2 of the band-pass filter circuits 300 is very low at the resonance frequencies of the shunt resonators since they approximately short circuit the transmission to ground so the transmission does not make it to the output, and the anti-resonance frequencies of the series resonators since they approximately open circuit block the transmission from reaching between the ports. The frequencies where the filter transmission is very low are commonly referred to as "transmission zeros" although the transmission through the filter will not be exactly zero. In a typical ladder or half ladder band-pass filter, the resonance frequencies of shunt resonators are less than a lower edge of the filter passband (e.g., passband frequencies) to create transmission zeros at frequencies below the passband. The anti-resonance frequencies of shut resonators typically fall within the passband of the filter to create almost no effect at frequencies in the passband. Conversely, the anti-resonance frequencies of series resonators are greater than an upper edge of the passband to create transmission zeros at frequencies above the passband. The resonance frequencies of series resonators typically fall within the passband of the filter. In some designs, one or more shunt resonators may have resonance frequencies higher than the upper edge of the passband frequencies to ensure transmission zeros at frequencies above the passband. To ensure that the anti-resonance frequencies of shunt resonators and the resonance frequencies of series resonator are within the passband, the differences between the resonance and anti-resonance frequencies of each of the filter resonators is typically smaller than the bandwidth of the filter. In some cases, the differences between the resonance and anti-resonance frequencies of all resonators are typically smaller than the bandwidth of the filter.

To provide a filter with uniform transmission in the passband and adequate stopbands above and below the passband, it is generally necessary for (1) the resonators to be free of significant spurious modes at frequencies within the passband, (2) the transmission zeros be distributed at multiple frequencies above and below the passband, and (3) the antiresonance frequencies of shunt resonators and the resonance frequencies of series resonators be distributed at multiple frequencies within the passband. These requirements limit the bandwidth of a filter to a maximum of about 1.6 times the differences between the resonance and anti-resonance frequencies of the resonators.

For example, the admittance characteristic graphed in FIG. 2B is representative of an XBAR using a rotated Y-cut lithium niobate piezoelectric plate as described in U.S. Pat. No. 10,790,802. Rotated Y-cut XBARs have the highest electromechanical coupling and thus the widest separation between their resonance and anti-resonance frequencies. The difference between the anti-resonance and resonance frequencies of the example resonator is about 650 MHz.

Passive reactive components, such as inductors and/or capacitors, may be incorporated in filters to provide filter bandwidth that cannot be achieved using only resonators.

Figures 4A, 4B, 4C:
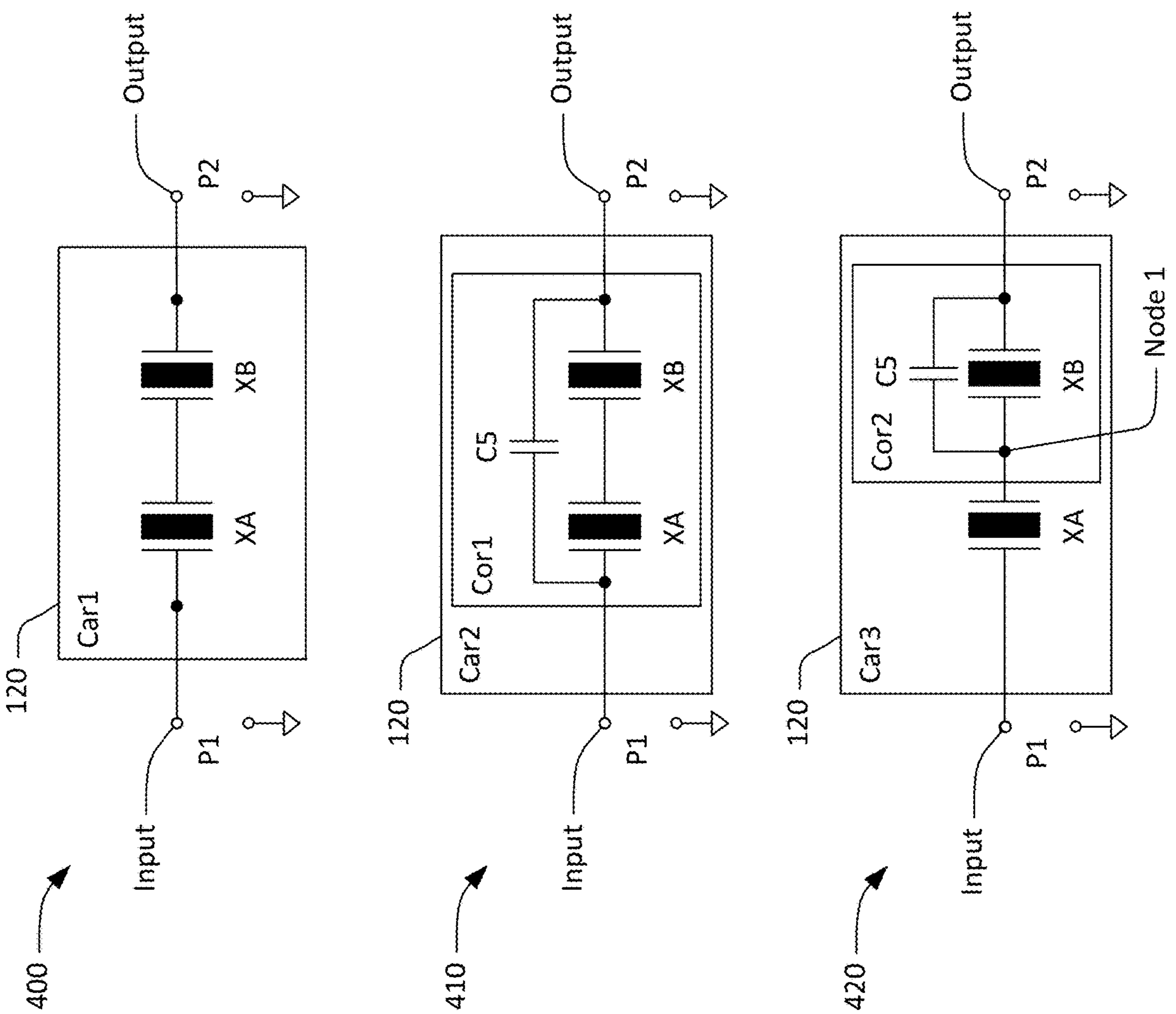
FIG. 4A is a schematic diagram of a filter circuit with a cascaded resonator circuit having two resonators.
FIG. 4B is a schematic diagram of a filter circuit with a cascaded resonator circuit having two resonators, and a composite XBAR resonator circuit with a capacitor in parallel with both resonators for improved rejection.
FIG. 4C is a schematic diagram of a filter circuit with a cascaded resonator circuit having two resonators, and a composite XBAR resonator circuit with a capacitor in parallel with one resonator to further improved rejection.

FIG. 4A is a schematic diagram of a filter circuit 400 with a cascaded resonator circuit Car1 having two resonators XA and XB. A cascaded resonator circuit has two substantially identical resonators or resonator sections in series. The admittance as a function of frequency of the two resonators XA and XB is substantially identical. The admittances as functions of frequency of the two acoustic resonators being substantially identical may mean that the admittance functions are within 2 to 5 percent of each other in amplitudes between and in frequency spread between antiresonance and resonance frequency. In some cases, substantially identical means the functions are within 1 to 3 percent in amplitude and in spread. It may mean within 5 and 10 percent in amplitude and spread. In some cases, substantially identical may mean that the two resonators have at least the same resonance frequency, anti-resonance frequency, and static capacitance. The two resonators XA and XB may be SAWs. In other cases, they are XBARs. They could also be any of a number of other types of resonators (BAW, FBAR, TC-SAW, MEMs, etc.). The two acoustic wave resonators are typically, but not necessarily, the same type of resonator. The two resonators XA and XB may be connected in series on a substrate, printed circuit board (PCB), integrated circuit (IC) or chip. In some cases, they are formed on the same substrate 120 as shown. The two resonators XA and XB may be substantially identical in physical dimensions. Physical dimensions being substantially identical may mean they are formed with the same substrate and piezoelectric plate; and have the substantially identical physical dimensions. These physical dimensions may include the and the thickness of the IDT and the pitch and width of the fingers. The being substantially identical may mean that the physical dimensions are within 2 to 5 percent of each other. In some cases, substantially identical means the functions are within 1 to 3 percent. It may mean withing 5 and 10 percent.

FIG. 4B is a schematic diagram of a filter circuit 410 with a cascaded resonator circuit Car2 having two resonators XA and XB; and with a composite resonator circuit Cor1 with a capacitor C5 in parallel with both resonators XA and XB for improved rejection. In filter 410, Car2 and Cor1 are the same thing. In some cases, they are formed on the same substrate 120 as shown. The capacitor C5 may be implemented, for example, by a conductor (e.g., forming a capacitor) on the substrate containing the resonator XB; by a conductor on the chip containing the resonator XB; by a conductor on a printed wiring board containing or coupled to the resonator chip; or as a discrete chip capacitor.

Filter circuit 410 uses a capacitor C5 in parallel to a cascaded resonator Car2 in order to shift the anti-resonance frequency 214 of the combined resonators lower in frequency creating a steeper transition from resonance 212 to anti-resonance 214 which translates to a steeper filter skirt when used in a filter design. This technique slightly degrades the filter bandwidth and also degrades the rejection on the high side (e.g., upper passband edge) of the filter passband.

FIG. 4C is a schematic diagram of a filter circuit 420 with a cascaded resonator circuit Car3 having two resonators XA and XB; and with a composite resonator circuit Cor2 with a capacitor C5 connected in parallel with one resonator XB of circuit Car3 to further improve rejection. The two resonators XA and XB, and capacitor C5 are all connected to each other at Node 1. Resonator XB and capacitor C5 may be connected in parallel. They may have their input and output terminals directly attached. Their input terminals may have the same voltage and their output terminals may have the same voltage.

Figure 10:
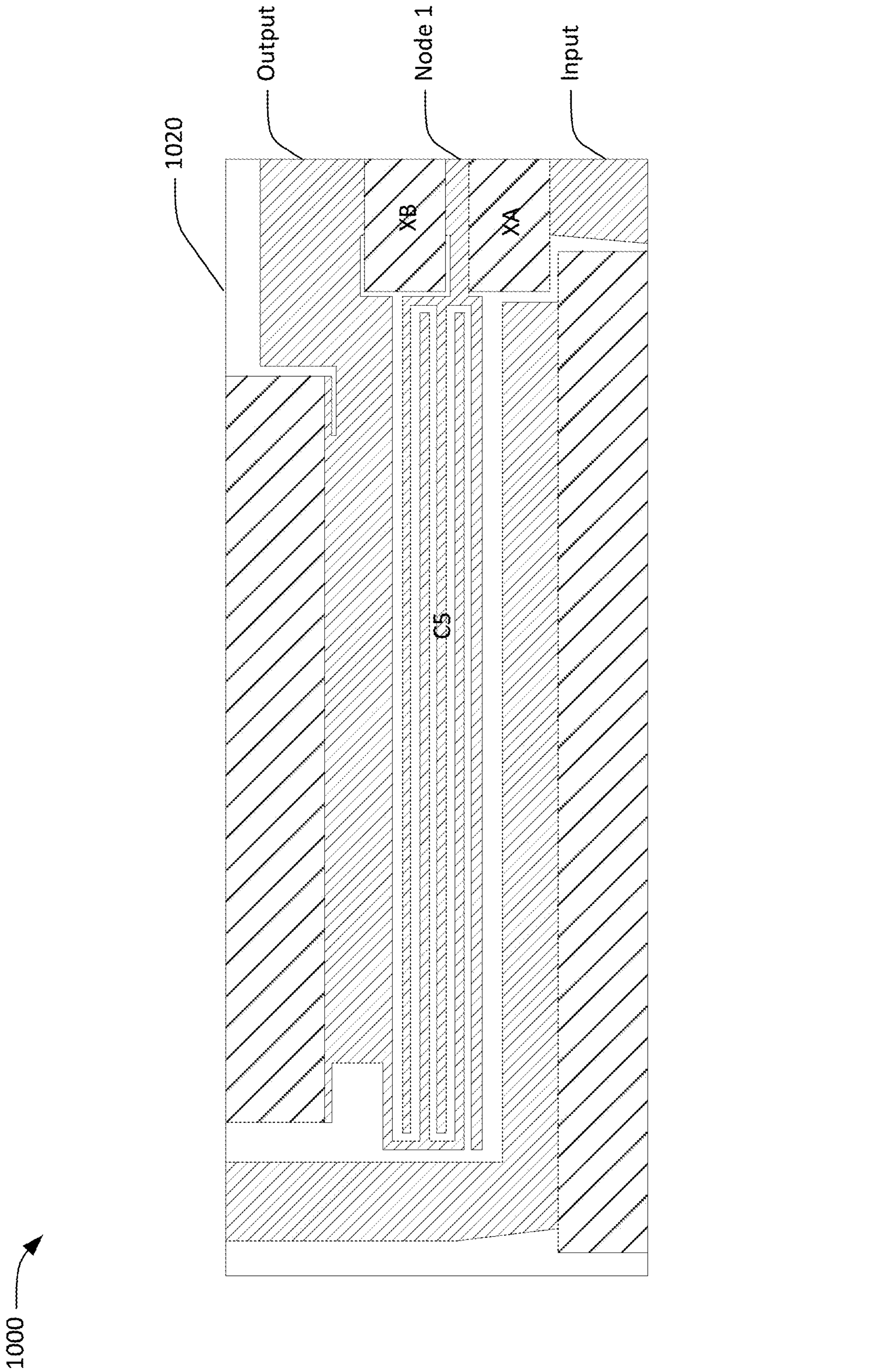
FIG. 10 is a hardware implementation of a portion of a filter having series and shunt resonators and having the filter circuit of FIG. 4C.

The two resonators XA and XB, and capacitor C5 may be formed on or in the same substrate, printed circuit board (PCB), IC or chip. In some cases, they are formed on the same substrate 120 as shown. In FIG. 4A, FIG. 4B and FIG. 4C the resonators are formed on the same substrate with the substrate being denoted by 120. The implementation of the capacitors C5 can be on the substrate with the resonators or on the PCB. In some cases, the resonators are not formed on the PCB. FIG. 10 shows the capacitor C5 being formed on the substrate.

A composite resonator is a circuit combining an acoustic resonator and a passive reactive component such as a capacitor or inductor. The acoustic resonator and a capacitor may be connected in parallel on a substrate, printed circuit board (PCB), IC or chip. For example, composite resonator Cor2 has a capacitor C5 in parallel with half of a cascaded resonator Car3 to improve the steepness of the upper or higher bandpass edge of filter circuit 420.

Cascaded resonator circuit Car3 uses the first and second acoustic resonators XA and XB in series to pass passband frequencies of the filter circuit, the passband frequencies between a lower bandpass edge and the upper bandpass edge. Filter circuit 420 uses a capacitor C5 in parallel of only one of the cascaded resonators, resonator XB, to shift the anti-resonant frequency 214 of only one resonator XB down in frequency. Filter circuit 420 uses a capacitor C5 in parallel with resonator XB in order to shift the anti-resonance frequency 214 of the combined resonators lower in frequency creating a steeper transition from resonance 212 to anti-resonance 214 which translates to a steeper filter skirt when used in a filter design.

The composite resonator circuit Cor2 reduces an anti-resonance frequency 214 and steepens a filter skirt of the filter circuit. This shifted anti-resonance creates a steeper filter skirt but has very little effect on the filter passband. Filter circuit 420 also has minimal degradation to the filter rejection on the high side of the passband.

Capacitor C5 may be connected between and have a same voltage at an input and an output of the second acoustic resonator XB. Capacitor C5 may be connected between a junction (e.g., node N1) between a first resonator X1 and a second resonators X3 and an input of a third resonator X2, such as of FIG. 3A.

Each of filter circuits 400, 410 and 420 is a filter of sorts but is more useful as a building block in more complex filter circuits, such as filter 300. Each of filter circuits 400, 410 and 420 has a first port P1 and a second port P2. The ungrounded terminal of the first port will be considered the input to the filter. The ungrounded terminal of the second port will be considered the output of the filter. The filter is bidirectional and either ungrounded terminal could be the input or output. For ease of explanation, it is assumed the signal flow is from left to right such that Port 1 is the input port and Port 2 is the output port. Any of filter circuits 400, 410 and 420 may be used as a series resonator or a shunt resonator.

FIGS. 5-9 may be graphs of characteristics of three filters which each have eight series and eight shunt resonators, and which each have one of filter circuits 400, 410 and 420 as the sixth series resonator as noted for filter 350 of FIG. 3B. As a reminder, the three filters have sixth series resonator X11 replaced by filter circuit 400, 410 or 420. The resonators in these 3 filters may be SAW, XBAR or another acoustic resonator.

Figure 5:
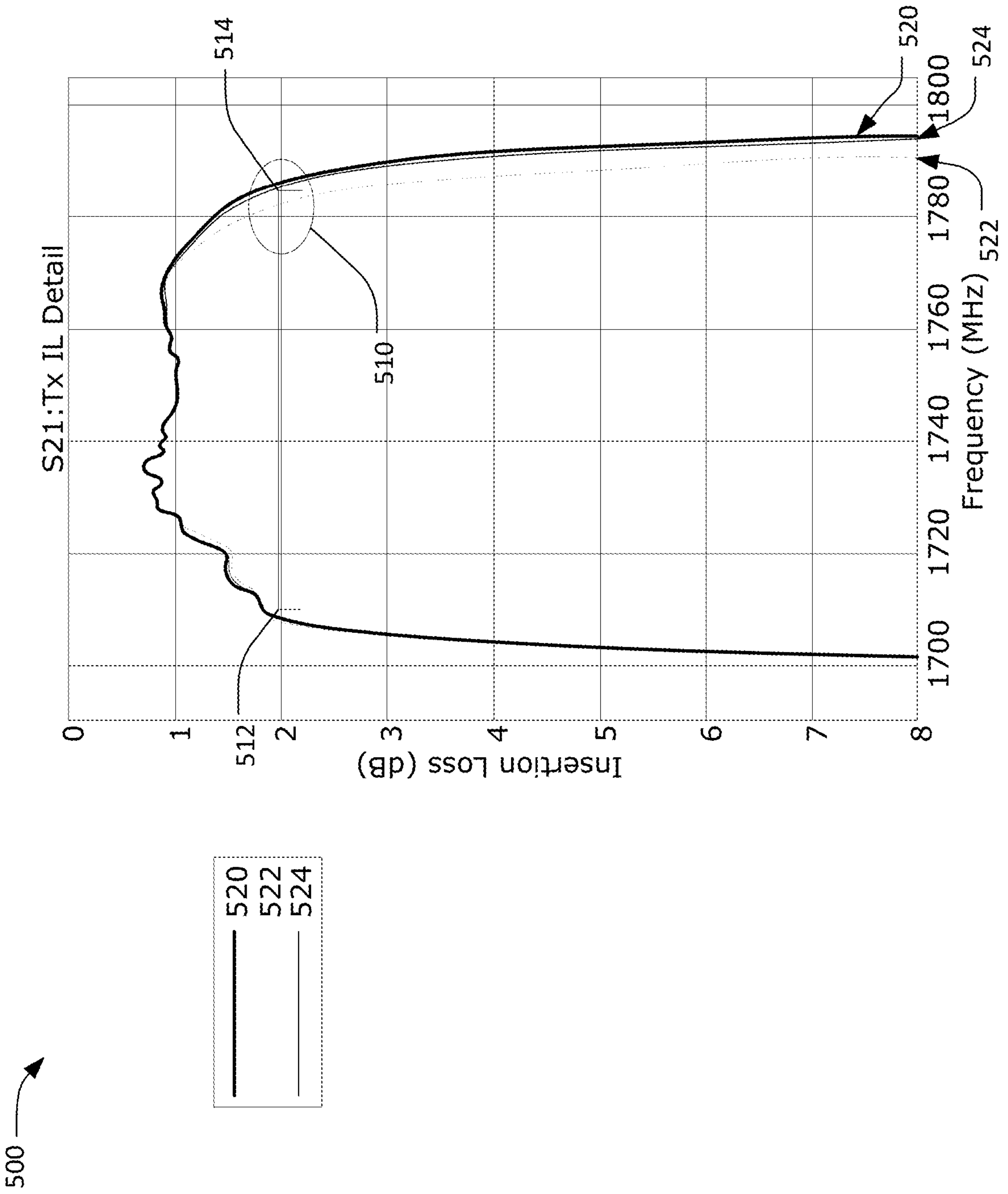
FIG. 5 is a graph of the insertion losses of the input-output transfer functions S21 of filters having series and shunt resonators and having exemplary filter circuits as shown in FIG. 4A-C.

FIG. 5 is a graph 500 of the insertion losses of the input-output transfer functions S21 of filters having series and shunt resonators and having exemplary filter circuits 400, 410 and 420 as shown in FIG. 4A-C. Graph 500 shows the S21 transfer function Tx insertion loss detail of these filters as a function of frequency. FIG. 5 contains three s-parameter plots of the three implementations: each having the sixth series resonator as one of filter circuit 400, 410 and 420. For FIG. 5, resonator X11 is comprised of two resonators in series, XA and XB. For FIG. 5, resonator X11 is replaced by filter circuit 400, 410 and 420. FIG. 10 shows a close-up of the connection between resonators XA and XB (those two resonators make up resonator X11) and the capacitor C5.

The thick solid curve 520 is a plot of the magnitude of the insertion loss of the input-output transfer function S21 of a first of the three filters having series and shunt resonators and having a sixth series resonator as filter circuit 400. The dashed curve 522 is a plot of the magnitude of the insertion loss of the input-output transfer function S21 of a second of the three filters having series and shunt resonators and having a sixth series resonator as filter circuit 410. The thin solid curve 524 is a plot of the magnitude of the insertion loss of the input-output transfer function S21 of a third of the three filters having series and shunt resonators and having a sixth series resonator as filter circuit 420. Graph 500 shows lower passband edge 512 and upper passband edge 514 of the passband for the filters, such as for a passband with insertion loss that is above or not less than −2 dB.

As shown in circle 510, the insertion loss of curve 522 has a loss of 3.93 MHz at upper passband edge 514 as compared to the loss of curve 520, while the insertion loss of curve 524 has a loss of only 0.6 MHz at upper passband edge 514 as compared to the loss of curve 520. This shows that the one of the three filters with filter circuit 420 has minimal effect on insertion loss at passband edge 514 while the one of the three filters with filter circuit 410 has more degradation at passband edge 514. This makes the one of the three filters with filter circuit 420 more desirable than the ones of the three filters with filter circuit 410 and 400.

Figure 6:
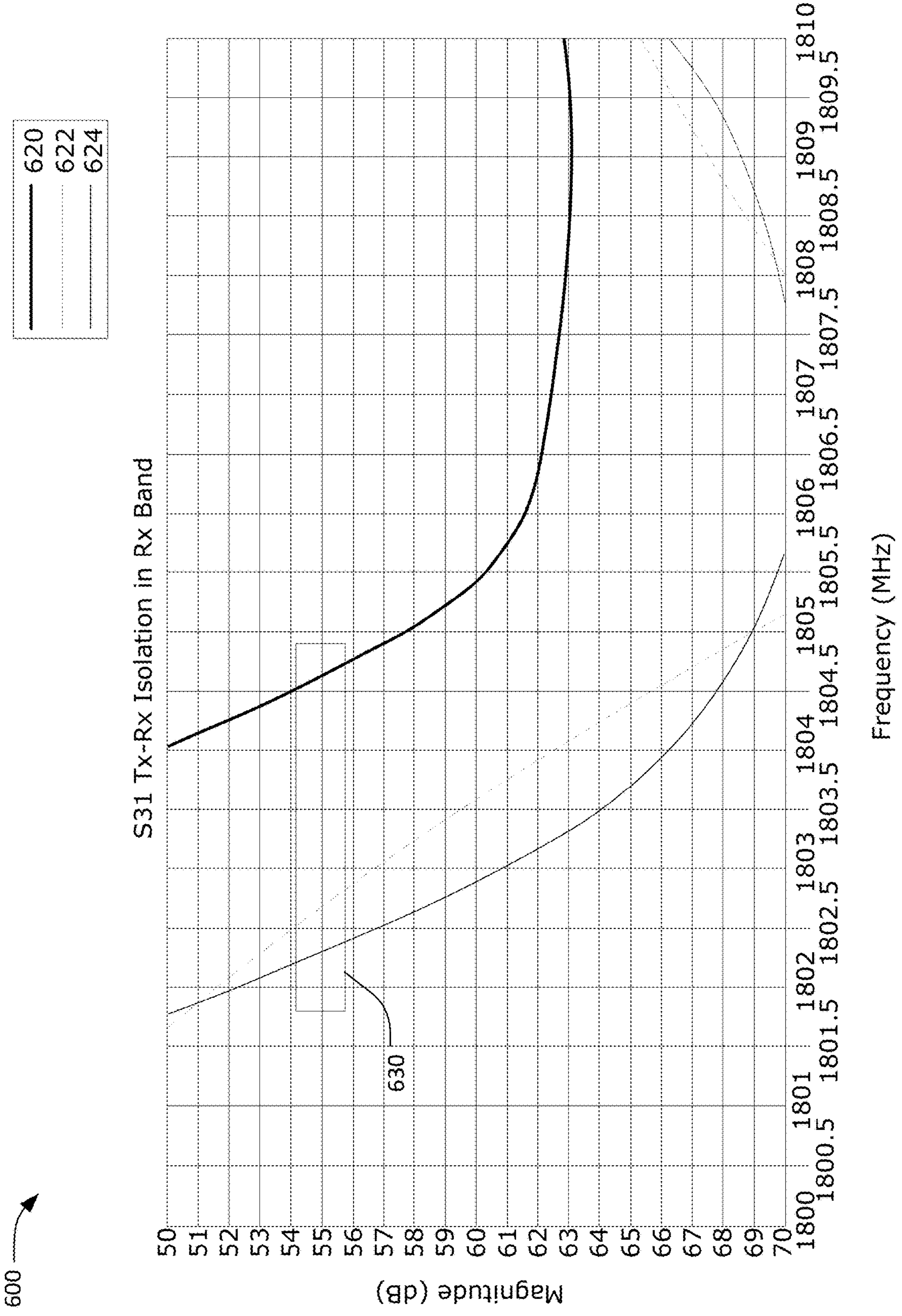
FIG. 6 is a graph of the magnitude of the input-output transfer functions S31 of filters having series and shunt resonators and having exemplary filter circuits as shown in FIG. 4A-C.

FIG. 6 is a graph 600 of the magnitude of the input-output transfer functions S31 of filters having series and shunt resonators and having exemplary filter circuits 400, 410 and 420 as shown in FIG. 4A-C. Graph 600 shows the S31 transfer function Tx-Rx isolation in Rx Band of these filters as a function of frequency.

The thick solid curve 620 is a plot of the magnitude of the isolation of the input-output transfer function S31 of the one of the three filters with filter circuit 400. The dashed curve 622 is a plot of the magnitude of the isolation of the input-output transfer function S31 of the one of the three filters with filter circuit 410. The thin solid curve 624 is a plot of the magnitude of the isolation of the input-output transfer function S31 of the one of the three filters with filter circuit 420. Graph 600 shows lower passband edge slope 630 of the upper passband edge 514 of the passband for the filters, such as for a lower slope that is below or less than −50 dB. Slope 630 may be in a frequency range that is greater than and immediately adjacent the bandpass edge 514. Slope 630 may be at the bottom edge of the bandpass edge slope for upper bandpass edge 514.

As shown at slope 630, the isolation of curve 622 only increased by 1.95 MHz at the lower passband edge slope as compared to the isolation of curve 620, while the insertion isolation of curve 624 has increased by 2.5 MHz at slope 630 as compared to the isolation of curve 620. Curve 624 is also steeper than curve 622 at slope 630. This shows that the one of the three filters with filter circuit 420 has increased isolation while the one of the three filters with filter circuit 410 has less isolation above passband edge 514 and/or at slope 630. This makes the one of the three filters with filter circuit 420 more desirable than the ones of the three filters with filter circuit 410 and 400.

Figure 7:
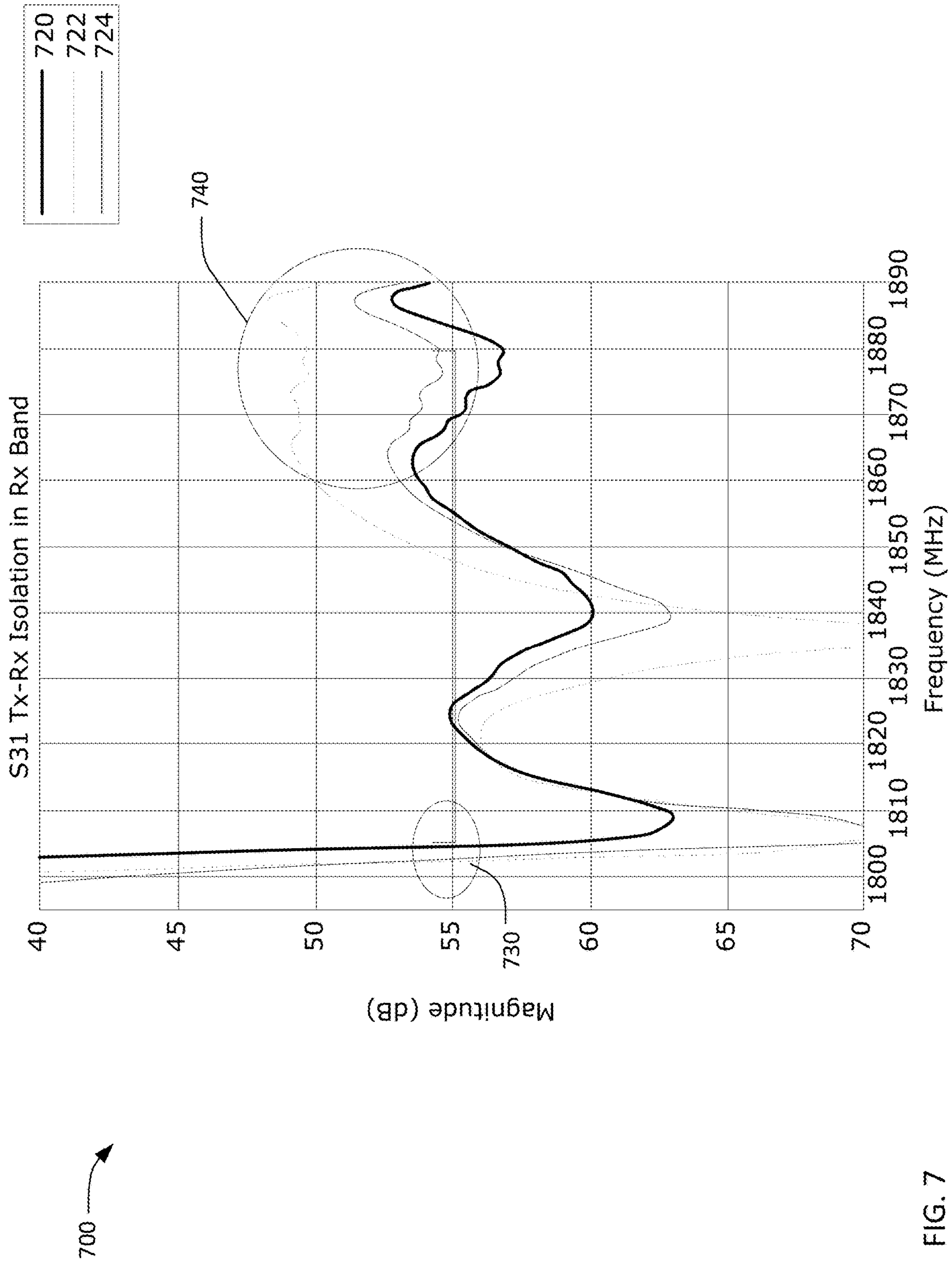
FIG. 7 is a graph of the magnitude of the input-output transfer functions S31 of filters having series and shunt resonators and having exemplary filter circuits as shown in FIG. 4A-C; over a larger frequency range than FIG. 6.

FIG. 7 is a graph 700 of the magnitude of the input-output transfer functions S31 of filters having series and shunt resonators and having exemplary filter circuits 400, 410 and 420 as shown in FIG. 4A-C; over a larger frequency range than FIG. 6. Graph 700 shows the S31 transfer function Tx-Rx isolation in Rx Band of these filters as a function of frequency.

The thick solid curve 720 is a plot of the magnitude of the isolation of the input-output transfer function S31 of the one of the three filters with filter circuit 400. The dashed curve 722 is a plot of the magnitude of the isolation of the input-output transfer function S31 of the one of the three filters with filter circuit 410. The thin solid curve 724 is a plot of the magnitude of the isolation of the input-output transfer function S31 of the one of the three filters with filter circuit 420. Graph 700 shows lower passband edge slope 730 of the upper passband edge 514 of the passband for the filters, such as for a lower slope that is between −50 and −60 dB. Slope 730 may be at the bottom edge of the bandpass edge slope 630 for upper bandpass edge 514. Slope 730 may be in a frequency range that is greater than and immediately adjacent to the bandpass edge 514.

Graph 700 also shows degradation region 740 that is greater in frequency than and away from (e.g., not immediately adjacent to) the upper bandpass edge 514. Region 740 may be between 20 and 100 MHz above the slope 710 or edge 514.

As shown at slope 730, the isolation of curve 724 has increased isolation and a steeper slope as compared to slopes 722 and 720 at the bottom edge of the bandpass edge slope 630 for upper bandpass edge 514. This makes the one of the three filters with filter circuit 420 more desirable than the ones of the three filters with filter circuit 410 and 400. Slope 730 may include slope 630.

As shown at degradation region 740, the isolation of curve 624 has less degradation as compared to slope 722 at the region 740 away from upper bandpass edge 514. This makes the one of the three filters with filter circuit 420 more desirable than the one of the three filters with filter circuit 410.

Figure 8:
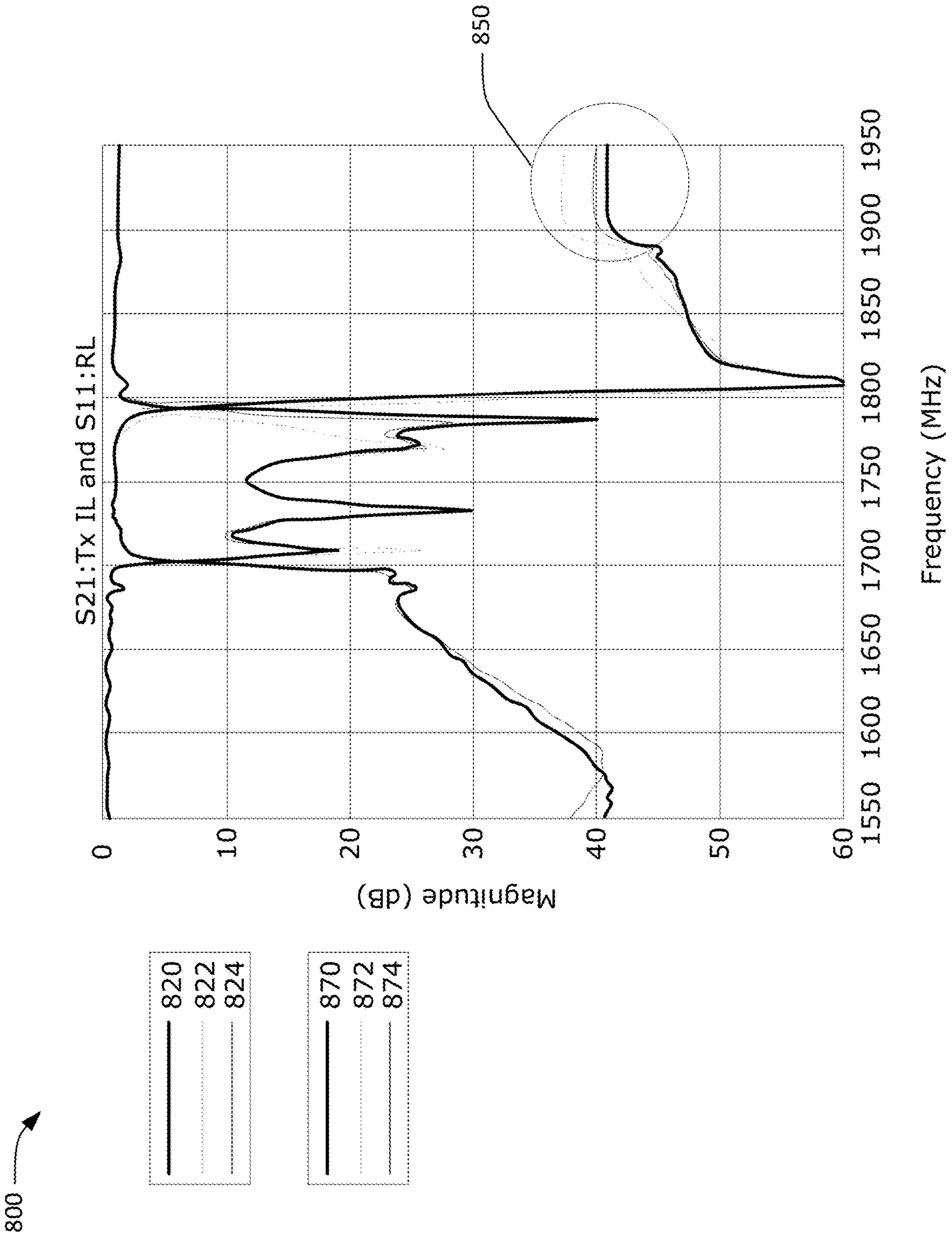
FIG. 8 is a graph of the magnitude of the input-output transfer functions S31 of filters having series and shunt resonators and exemplary filter circuits as shown in FIG. 4A-C; over a larger frequency range than FIG. 7.

FIG. 8 is a graph 800 of the magnitude of the input-output transfer functions S31 of filters having series and shunt resonators and having exemplary filter circuits 400, 410 and 420 as shown in FIG. 4A-C; over a larger frequency range than FIG. 7. Graph 800 shows the S21 transfer function Tx insertion loss detail and the S11 transfer function rejection loss detail of these filters as a function of frequency.

The thick solid curves 820 and 870 are plots of the magnitude of the insertion loss and rejection loss of the one of the three filters with filter circuit 400. The dashed curves 822 and 872 are plots of the magnitude of the insertion loss and rejection loss of the one of the three filters with filter circuit 410. The thin solid curves 824 and 874 are plots of the magnitude of the insertion loss and rejection loss of the one of the three filters with filter circuit 420. Graph 800 also shows degradation region 850 that is greater in frequency than and away from the upper bandpass edge 514. Region 850 may be between 50 and 150 MHz above the edge 514.

As shown at degradation region 850, the rejection degradation of curve 824 and 874 is less than that of curve 822 and 872 at the region 850. Curve 822 has degraded rejection as compared to curve 824. This makes the one of the three filters with filter circuit 420 more desirable than the one of the three filters with filter circuit 410.

Figure 9:
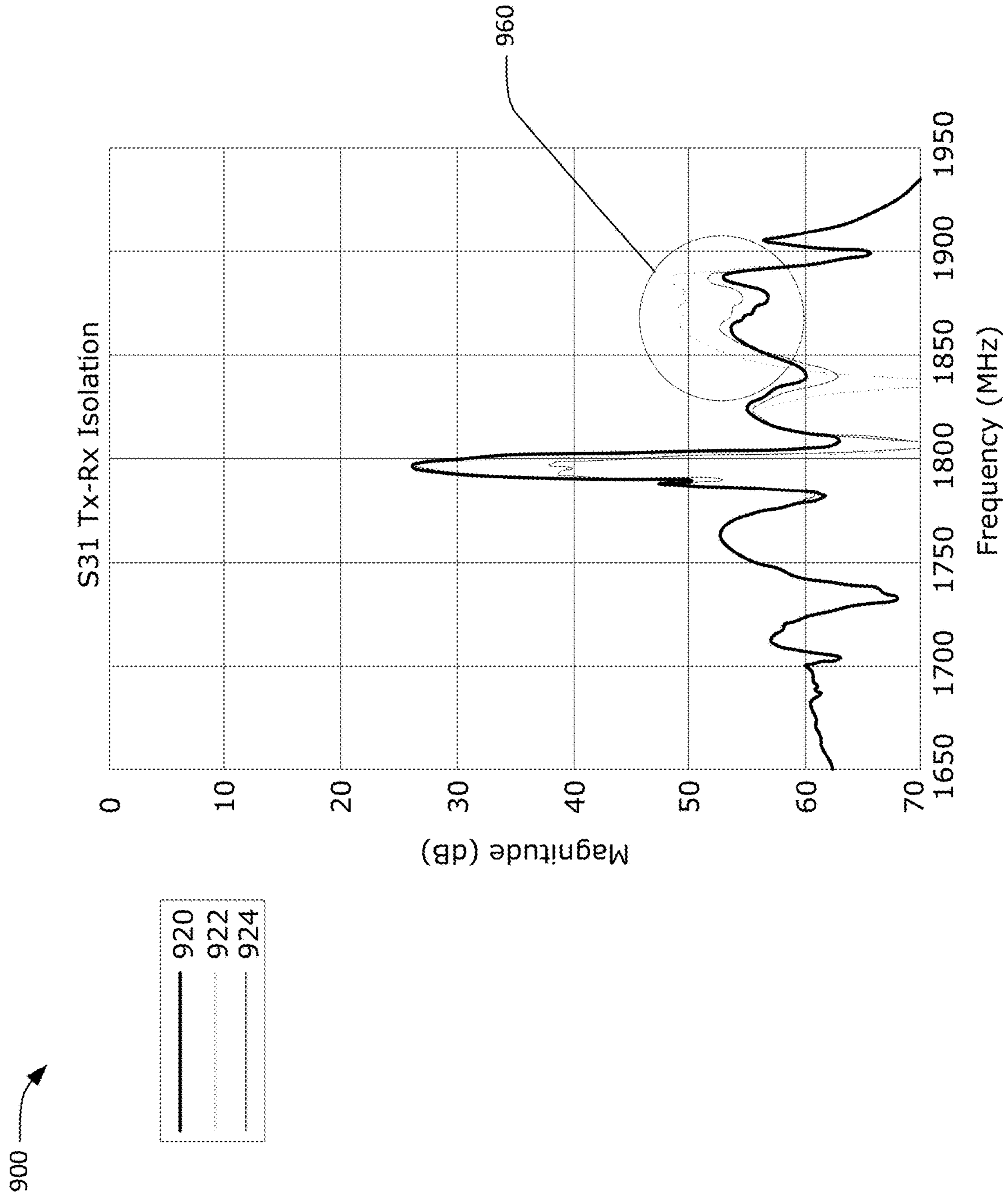
FIG. 9 is a graph of the magnitude of the input-output transfer functions S31 of filters having series and shunt resonators and having exemplary filter circuits as shown in FIG. 4A-C.

FIG. 9 is a graph 900 of the magnitude of the input-output transfer functions S31 of filters having series and shunt resonators and having exemplary filter circuits 400, 410 and 420 as shown in FIG. 4A-C. Graph 900 shows the S31 transfer function Tx-Rx isolation in Rx Band of these filters as a function of frequency.

The thick solid curve 920, dashed curve 922 and thin solid curve 924 are plot of the magnitude of the isolation of the input-output transfer function S31 of the three filters with filter circuits 400, 410 and 420 respectively. Graph 900 shows isolation degradation region 960 that is greater in frequency than and away from the upper bandpass edge 514. Region 960 may be between 50 and 150 MHz above the edge 514.

As shown at degradation region 960, the isolation degradation of curve 924 is less than that of curve 922 at the region 960. Curve 922 has degraded isolation as compared to curve 924. This makes the one of the three filters with filter circuit 420 more desirable than the one of the three filters with filter circuit 410.

As shown in FIGS. 5-9, the one of the three filters with filter circuit 420 improves isolation, improves rejection and/or decreases degradation as compared to the ones of the three filters with filter circuits 400 and 410. The one of the three filters with filter circuit 420 has less degradation to isolation away from the band edge 514 as compared to the ones of the three filters with filter circuits 400 and 410. The one of the three filters with filter circuit 420 may improve the steepness of the transfer function curve at or past upper band edge 514 of the filter as compared to the ones of the three filters with filter circuits 400 and 410. It may improve the steepness of the curve before and at the higher passband edge 514 as compared to the ones of the three filters with filter circuits 400 and 410. It may improve the steepness of the curve at and into a transmission zero as compared to the ones of the three filters with filter circuits 400 and 410. It may improve the steepness of the curve at the higher passband edge of the filter between the desired and undesired signal frequencies as compared to the ones of the three filters with filter circuits 400 and 410.

The curves for the one of the three filters with filter circuit 420 may have a steeper slope and increased isolation at the bottom edge 630 as compared to the ones of the three filters with filter circuits 400 and 410. The difference in the curves of these filters at edge 514, slope 630 and/or slope 710 may describe a steeper filter skirt for the one of the three filters with filter circuit 420 as compared to the ones of the three filters with filter circuits 400 and 410, such as where the curves of FIG. 5 resemble a skirt.

In some cases, the one of the three filters with filter circuit 420 improves a steepness of a lower slope 630 of the upper bandpass edge 514, where edge 514 has an upper slope (not shown) just below edge 514 and a lower slope 630 as shown in FIG. 6 that is outside, beyond or greater in frequency than the upper passband edge. The use of filter circuit 420 improves a steepness of the resonance to anti-resonance frequency curve at the upper bandpass edge 514 of the filter.

FIG. 10 is a hardware implementation 1000 of a portion of a filter having series and shunt resonators and having filter circuit 420 of FIG. 4C. Implementation 1000 may be small portion of one of the three filters that apply to FIGS. 5-9 with eight series and eight shunt resonators, where implementation 1000 shows filter circuit 420 as the sixth series resonator or that replaces resonator X11. Implementation 1000 shows a cascaded resonator circuit having two resonators XA and XB; and with a composite resonator circuit with a capacitor C5 connected in parallel with one resonator XB of the cascaded resonator circuit for improved rejection. The two resonators XA and XB, and capacitor C5 are all connected to each other at Node 1.

The resonator XA, resonator XB and capacitor C5 are formed in and/or formed on a single substrate, printed circuit board (PCB), IC or chip which is represented as substrate 1020. In some cases, they are all formed on the same substrate 120. The resonator XA, resonator XB and capacitor C5 are connected to each other by a conductor pattern such as having conductor traces on and/or in the substrate 1020.

The resonator XA, resonator XB and capacitor C5 may be monolithically disposed on substrate 1020 or on a piezoelectric plate similar to plate 110 on top of that substrate. Capacitor C5 may be a lumped capacitive structure monolithically disposed on the substrate 1020 or on the piezoelectric plate, and may be electrically connected to the acoustic resonator structures. Capacitor C5 may be a lumped capacitive structure comprising an arrangement of planar interdigitated capacitive fingers, wherein at least one of the interdigitated capacitive fingers and at least one of the interdigitated resonator fingers have orientations that are oblique to each other. Capacitor C5 may be a thin film conductor pattern formed on a surface of the substrate 1020 or on the piezoelectric plate. It may be formed by conductor traces on a PCB or substrate 120. Capacitor C5 may be formed when forming the IDT 130 or a conductor pattern that includes the IDT 130. Capacitor C5 may include parallel fingers connected to each other at ends of the capacitor to form a switch back pattern extending from the input to the output of the capacitor. The ends of the capacitor may be electrically coupled in parallel to the acoustic resonator structure XB.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

What is claimed:

1. A filter circuit comprising:

a resonator circuit having a first acoustic resonator and a second acoustic resonator connected in series on a single chip; and a composite resonator circuit comprising a capacitor connected in parallel with the first acoustic resonator and the second acoustic resonator on the single chip, wherein each of the first and second acoustic resonators comprises:

a substrate;

a piezoelectric layer having a first portion supported by the substrate and a second portion that is over a cavity; and an interdigital transducer (IDT) on a surface of the piezoelectric layer, the IDT including interleaved fingers on the second portion of the piezoelectric layer that is over the cavity, wherein the first and second acoustic resonators have a substantially identical sized cavity, a substantially identical thickness and a substantially identical pitch of the interleaved fingers, and wherein the first and second acoustic resonators have a substantially same resonance frequency, anti-resonance frequency, and static capacitance.

2. The filter circuit of claim 1, wherein the first and second acoustic resonators comprise the same substrate and the same piezoelectric layer.

3. The filter circuit of claim 1, wherein the capacitor is connected between an input and an output of the second acoustic resonator.

4. The filter circuit of claim 1, wherein the capacitor is at a junction between the first and second acoustic resonators and an input of a third resonator.

5. The filter circuit of claim 1, wherein the first and second acoustic resonators are one of surface acoustic wave (SAW) resonators or transversely-excited film bulk acoustic resonators (XBARs).

6. The filter circuit of claim 1, wherein the capacitor comprises conductor traces on the single chip having the first and second acoustic resonators.

7. The filter circuit of claim 1, further comprising:

a plurality of series resonators connected in series between a first port and a second port, the plurality of series resonators including a first series resonator and a second series resonator connected at a node; and a plurality of shunt resonators including a first shunt resonator coupled between the node and a ground, wherein the resonator circuit and the composite resonator circuit are the second series resonator.

8. The filter circuit of claim 7, wherein the plurality of series resonators are 8 series resonators, the plurality of shunt resonators are 8 shunt resonators, and the resonator circuit and the composite resonator are a sixth one of the 8 series resonators.

9. The filter circuit of claim 7, wherein the composite resonator circuit is configured to provide a steeper transition from a resonance frequency of the filter circuit to an anti-resonance frequency of the filter circuit which translates to a steeper filter skirt of the filter circuit.

10. The filter circuit of claim 7, wherein the resonator circuit comprises the first and second acoustic resonators in series to pass passband frequencies of the filter circuit.

11. The filter circuit of claim 7, wherein the composite resonator circuit is configured to reduce an anti-resonance frequency and to steepen a filter skirt of the filter circuit.

12. A filter circuit comprising:

a first acoustic resonator and a second acoustic resonator connected in series on a substrate and having respective transfer functions, wherein each of the first and second acoustic resonators includes an interdigital transducer (IDT) on a piezoelectric layer, such that interleaved fingers of the IDT are disposed on a diaphragm of the piezoelectric layer that is over a cavity; and a capacitor connected in parallel with the second acoustic resonator on the substrate, wherein the first and second acoustic resonators have a substantially identical sized cavity, a substantially identical thickness and a substantially identical pitch of the interleaved fingers, and wherein the first and second acoustic resonators have a substantially same resonance frequency, anti-resonance frequency, and static capacitance.

13. The filter circuit of claim 12, wherein the first and second acoustic resonators comprise the same piezoelectric layer.

14. The filter circuit of claim 12, wherein the capacitor is connected between an input and an output of the second acoustic resonator.

15. The filter circuit of claim 12, wherein the capacitor is at a junction between the first and second acoustic resonators and an input of a third resonator.

16. The filter circuit of claim 12, wherein the capacitor comprises conductor traces on the substrate having the first and second acoustic resonators.

17. A filter circuit comprising:

a first acoustic resonator and a second acoustic resonator connected in series on a substrate;

a capacitor connected in parallel with the second acoustic resonator on the substrate;

a plurality of series resonators connected in series between a first port and a second port, the plurality of series resonators including a first series resonator and a second series resonator connected at a node; and a plurality of shunt resonators including a first shunt resonator coupled between the node and a ground, wherein the second series resonator includes the first acoustic resonator and the second acoustic resonator, and wherein the first and second acoustic resonators have a substantially identical sized cavity, a substantially identical thickness and a substantially identical pitch of interleaved fingers of interdigital transducers (IDTs) of the first and second acoustic resonators.

18. The filter circuit of claim 17, wherein the capacitor is connected either between an input and an output of the second acoustic resonator; or at a junction between the first and second acoustic resonators and an input of a third resonator.

19. The filter circuit of claim 17, wherein the capacitor comprises conductor traces on the substrate having the first and second acoustic resonators.

20. The filter circuit of claim 17, wherein the first and second acoustic resonators comprise a same substrate and a same piezoelectric layer.

* * * * *